United States Patent
Jeong et al.

(10) Patent No.: US 9,062,855 B2
(45) Date of Patent: Jun. 23, 2015

(54) DISPLAY DEVICE

(71) Applicants: Chang-Yong Jeong, Yongin (KR); Hyun-Geun Kim, Yongin (KR)

(72) Inventors: Chang-Yong Jeong, Yongin (KR); Hyun-Geun Kim, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 155 days.

(21) Appl. No.: 13/783,468

(22) Filed: Mar. 4, 2013

(65) Prior Publication Data

US 2013/0322052 A1  Dec. 5, 2013

(30) Foreign Application Priority Data

May 30, 2012  (KR) .......................... 10-2012-0057619

(51) Int. Cl.
- *F21V 15/00* (2006.01)
- *F21V 9/14* (2006.01)
- *G02F 1/1335* (2006.01)

(52) U.S. Cl.
CPC . *F21V 15/00* (2013.01); *F21V 9/14* (2013.01); *G02F 1/1335* (2013.01)

(58) Field of Classification Search
None
See application file for complete search history.

(56) References Cited

U.S. PATENT DOCUMENTS

2005/0248270 A1*  11/2005  Ghosh et al. .................. 313/512
2009/0278454 A1  11/2009  Fedorovskaya et al.

FOREIGN PATENT DOCUMENTS

| JP | 2009-192838 A | 8/2009 |
| KR | 10-2007-0112643 A | 11/2007 |
| KR | 10-2010-0078564 A | 7/2010 |

OTHER PUBLICATIONS

KR 10-2010-0078564 translation,Jang et al., published Aug. 7, 2010.*

* cited by examiner

*Primary Examiner* — Britt D Hanley
(74) *Attorney, Agent, or Firm* — Lee & Morse, P.C.

(57) ABSTRACT

A display device includes a substrate, a light emitting element layer that is on the substrate and that includes a light emitting element, an encapsulation thin film layer that is on the substrate and the light emitting element layer and that encapsulates the light emitting element layer, a buffer film on the encapsulation thin film layer and adhered to the encapsulation thin film layer, and an optical film on the buffer film and adhered to the buffer film.

7 Claims, 7 Drawing Sheets

DISPLAY DEVICE

CROSS-REFERENCE TO RELATED APPLICATION

This application claims priority to and the benefit of Korean Patent Application No. 10-2012-0057619 filed in the Korean Intellectual Property Office on May 30, 2012, the entire contents of which are incorporated herein by reference.

BACKGROUND

Popular types of display devices include, e.g., a liquid crystal display (LCD), a plasma display panel (PDP), an organic light emitting diode (OLED) display (OLED device), a field effect display (FED), and an electrophoretic display device.

SUMMARY

Embodiments may be realized by providing a display device that includes a substrate, a light emitting element layer formed on the substrate and including a light emitting element, an encapsulation thin film layer formed on the substrate and the light emitting element layer and encapsulating the light emitting element layer, a buffer film formed on the encapsulation thin film layer and adhered to the encapsulation thin film layer, and an optical film formed on the buffer film and adhered to the buffer film.

The optical film may be a polarizer. The optical film may be an ultraviolet (UV) preventing compensation film. The upper surface of the buffer film may be entirely adhered to the optical film, and the lower surface of the buffer film may be adhered to an edge portion of the encapsulation thin film layer.

The upper surface of the buffer film may be adhered to the edge portion of the optical film, and the lower surface of the buffer film may be adhered to the edge portion of the encapsulation thin film layer. The buffer film may be formed of a shape including the edge portion having an opening formed at a center portion, and the upper surface and the lower surface of the buffer film may be respectively adhered to the edge of the optical film and the encapsulation thin film layer.

Adhesion between the buffer film and the optical film may be weaker than a adhesion between the buffer film and the encapsulation thin film layer. Alternatively, adhesion between the buffer film and the optical film may be stronger than adhesion between the buffer film and the encapsulation thin film layer.

The buffer film may be an optically clear adhesive or a functional film for preventing moisture ($H_2O$) and oxygen ($O_2$) from easily penetrating into the encapsulation thin film layer. In the display device according to an exemplary embodiment of the present invention, the light emitting element layer may include an organic light emitting element.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
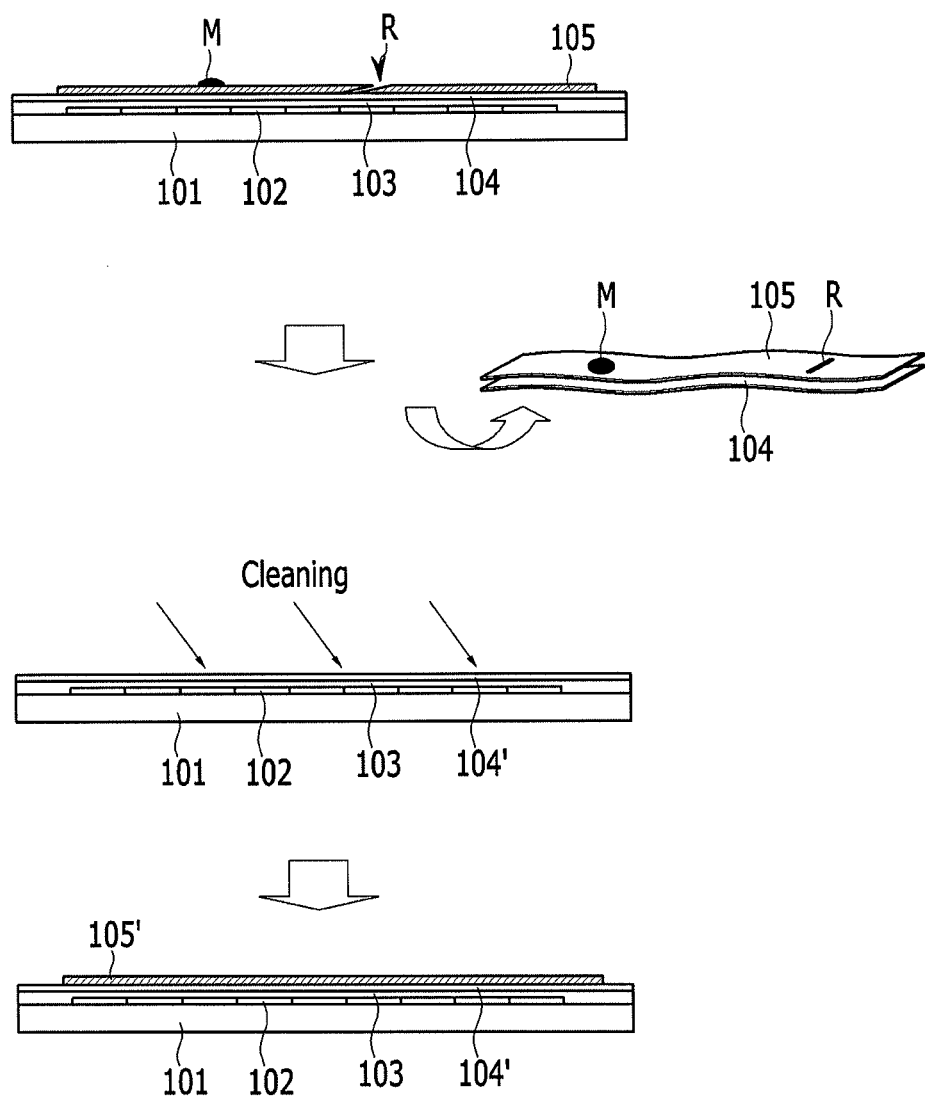
FIG. 1 is a view showing a rework process in a display device including a buffer film according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Further, like reference numerals denote like components throughout several exemplary embodiments. A first exemplary embodiment will be representatively described, and then only components other than those of the first exemplary embodiment will be described in other exemplary embodiments.

The drawings are schematic and not proportionally scaled down. Relative scales and ratios in the drawings are enlarged or reduced for the purpose of accuracy and convenience, and the scales are random and not limited thereto. In addition, like reference numerals designate like structures, elements, or parts throughout the specification. It will be understood that when an element is referred to as being "on" another element, it can be directly on another element or intervening elements may be present therebetween.

Exemplary embodiments illustrate exemplary views. As a result, modifications of diagrams may be expected. Accordingly, exemplary embodiments are not limited to specific shapes of shown regions, and for example, also include modifications of the shape by manufacturing.

Figure 2:
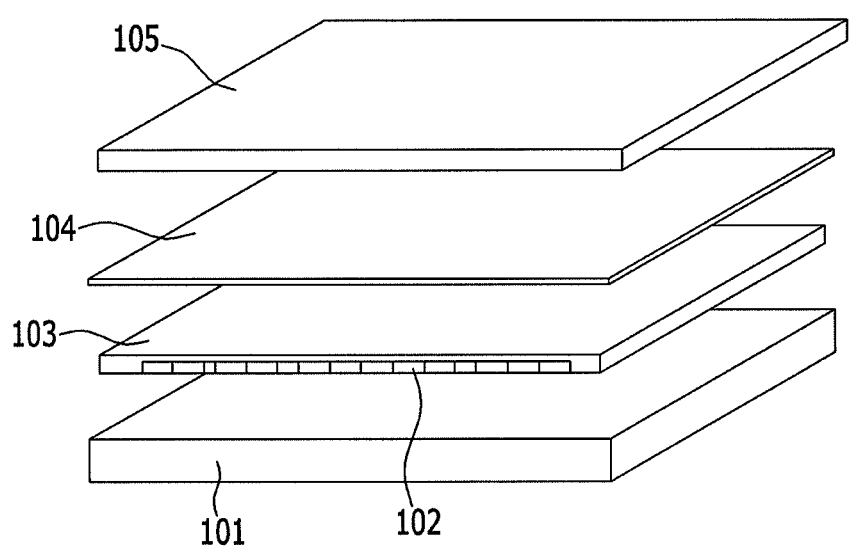
FIG. 2 is a perspective view of a display device including a buffer film according to an exemplary embodiment.
Figure 3A:
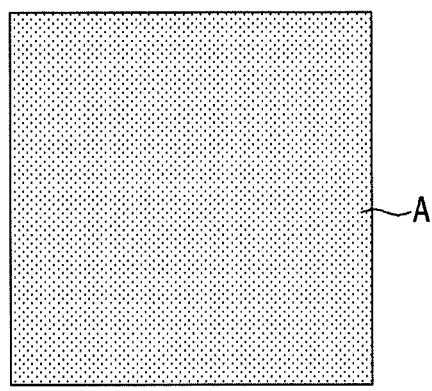
FIG. 3A is a top plan view of an upper surface of the buffer film in FIG. 2, according to an exemplary embodiment.
Figure 3B:
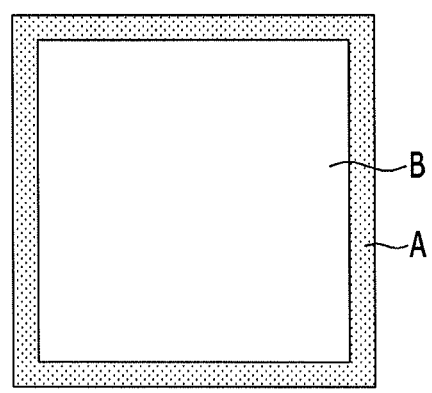
FIG. 3B is a top plan view of a lower surface of the buffer film in FIG. 2, according to an exemplary embodiment.

Next, a display device according to the first exemplary embodiment will be described with reference to FIG. 1 to FIG. 3B. FIG. 1 is a view showing a rework process in a display device including a buffer film according to the first exemplary embodiment, and FIG. 2 is a perspective view of a display device including a buffer film according to the first exemplary embodiment. FIG. 3A is a top plan view of an upper surface of a buffer film according to the first exemplary embodiment, and FIG. 3B is a top plan view of a lower surface of a buffer film according to the first exemplary embodiment.

As shown in FIG. 1 and FIG. 2, a display device may include a substrate 101, a light emitting element layer 102, an encapsulation thin film layer 103, a buffer film 104, and an optical film 105, e.g., in an sequentially stacked arrangement. The light emitting element layer 102 includes a light emitting element that is formed on the substrate 101. The encapsulation thin film layer 103 is formed on the substrate 101 and the light emitting element layer 102, and seals the light emitting element layer 102 from an upper side. The buffer film 104 is formed on the encapsulation thin film layer 103. The lower surface of the buffer film 104 and the upper surface of the encapsulation thin film layer 103 are adhered to each other. The optical film 105 is formed on the buffer film 104. The upper surface of the buffer film 104 and the lower surface of the optical film 105 are adhered to each other. The light emitting element layer 102 may be an organic emission layer including an organic light emitting element.

As shown in FIG. 1, in a structure in which the optical film 105 is formed at a highest portion of the display device, a defect such as a foreign particle M or a crack R may exist on the upper surface of the optical film 105. If the optical film 105 is detached for reworking, in a case that the buffer film 104 is attached to the lower surface of the optical film 105 and is further strongly attached to encapsulation thin film layer 103, the optical film 105 and the buffer film 104 may be detached together and the encapsulation thin film layer 103 may remain. Next, a new buffer film 104' may be formed on the encapsulation thin film layer 103 so as to be adhered to the encapsulation thin film layer 103. The new buffer film 104' may further be cleaned, and then if a new optical film 105' is adhered on the new buffer film 104', the rework process may be completed.

During a subsequent rework process that may be performed as shown in FIG. 1, the possibility of damage to the light emitting element layer 102 may be reduced and/or prevented by the buffer film 104. For example, as shown in FIG. 3A and FIG. 3B, the entire upper surface of the buffer film 104 may correspond to an adhesion region A, thereby the buffer film 104 may be adhered to the optical film 105 with the entire surface. Further, in the lower surface of the buffer film 104, only the edge portion may correspond to an adhesion region A. The remaining portions, which exclude the edge portion, may correspond to a non-adhesion region B such that the edge portion of the encapsulation thin film layer 103 is adhered to the buffer film 104. For example, the encapsulation thin film layer 103 may only be adhered to the buffer film 104 in the adhesion region A.

According to an exemplary embodiment, the strength of adhesion between the buffer film 104 and the optical film 105 may be stronger than the strength of adhesion between the buffer film 104 and the encapsulation thin film layer 103. In this case, the upper surface of the buffer film 104 may be strongly adhered to the entire lower surface of the optical film 105 such that the optical film 105 and the buffer film 104 are detached together in the adhered state when detaching the optical film 105 during the rework process. The lower surface of the buffer film 104 is adhered to the edge portion of the encapsulation thin film layer 103 corresponding to a non-active region (a non-light emitting region) of the light emitting element layer 102 such that the possibility of damage to the light emitting element layer 102 may be further reduced and/or prevented when detaching the optical film 105.

According to another exemplary embodiment, the strength of adhesion between the buffer film 104 and the optical film 105 may be weaker than the strength of adhesion between the buffer film 104 and the encapsulation thin film layer 103. When detaching the optical film 105, the buffer film 104 may remain in the deposited state on the encapsulation thin film layer 103. Accordingly, only the optical film 105 may be detached according to this exemplary embodiment. Therefore, after cleansing the buffer film 104, only a new optical film 105' is replaced, the rework process may be completed.

Figure 4:
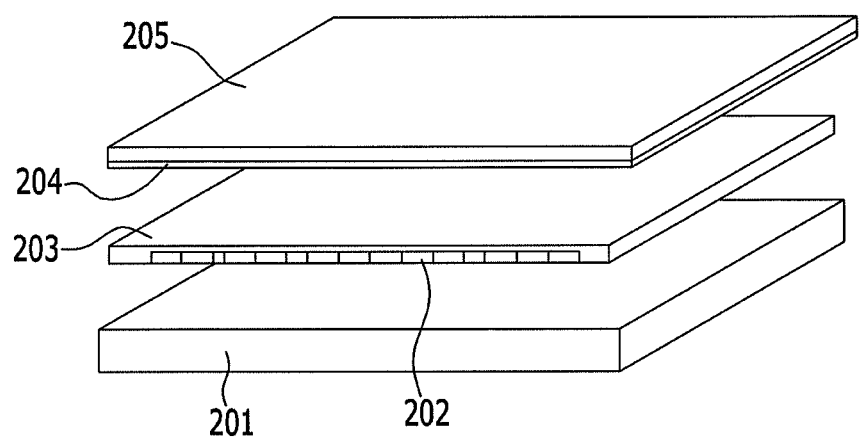
FIG. 4 is a perspective view of a display device including a buffer film according to an exemplary embodiment.
Figure 5:
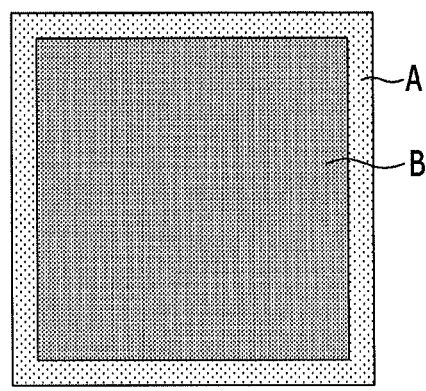
FIG. 5 is a plan view of the buffer film in FIG. 4, according to an exemplary embodiment.

FIG. 4 is a perspective view of a display device including a buffer film 204 according to the second exemplary embodiment, and FIG. 5 is a plan view of a buffer film according to the second exemplary embodiment. The buffer film 204 may be coupled to the substrate 201 in a manner as illustrated in FIG. 1 with respect to the first exemplary embodiment.

Referring to FIG. 4, a light emitting element layer 202 and an encapsulation thin film layer 203 are formed on the substrate 201. The buffer film 204 and an optical film 205 may be sequentially deposited on the encapsulation thin film layer 203, like the first exemplary embodiment. At this time, as shown in FIG. 5, the upper surface and the lower surface of the buffer film 204 may be substantially the same. For example, the upper and lower surfaces may both equally have the edge portion that corresponds to the adhesion region A, and the portion except for the edge portion that corresponds to the non-adhesion region B.

In this case of the buffer film 204, compared with the buffer film 104 according to the first exemplary embodiment, the adhesion material may be saved. For example, the lower surface of the buffer film 204 may be attached to the edge portion of the encapsulation thin film layer 203 corresponding to the non-active region of the light emitting element layer 202, and when detaching the optical film 205 during the rework process, the possibility of damage to the light emitting element layer 202 may be reduced and/or prevented. Further, in the second exemplary embodiment, the strength of adhesion between the buffer film 204 and the optical film 205 may be stronger or weaker than the strength of adhesion between the buffer film 204 and the encapsulation thin film layer 203.

For example, when the strength of adhesion between the buffer film 204 and the optical film 205 is stronger than the strength of adhesion between the buffer film 204 and the encapsulation thin film layer 203, if the optical film 205 is detached for reworking, the buffer film 204 may be detached therewith. Further, after cleansing the encapsulation thin film layer 202, a new buffer film and optical film are sequentially adhered to the encapsulation thin film layer 202 such that the rework process may be completed.

Alternatively, when the strength of adhesion between the buffer film 204 and the optical film 205 is weaker than the strength of adhesion between the buffer film 204 and the encapsulation thin film layer 203, if the optical film 205 is detached for reworking, the buffer film 204 may remain as it is on the encapsulation thin film layer 203, and only the optical film 205 is detached. Further, after cleansing the upper surface of the buffer film 204, if the optical film 205 is newly replaced, the rework process may be completed.

Figure 6:
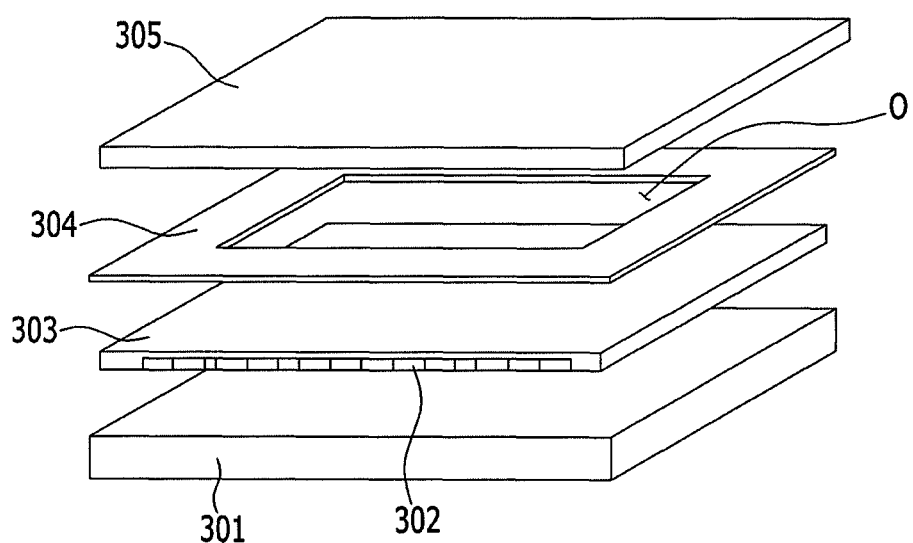
FIG. 6 is a perspective view of a display device including a buffer film according to an exemplary embodiment.
Figure 7:
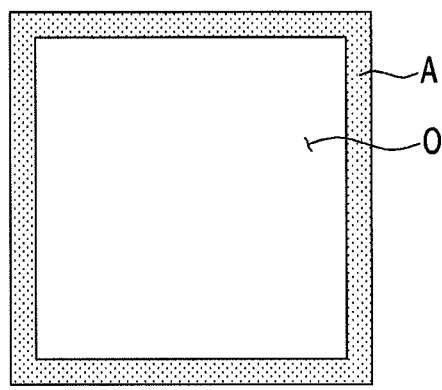
FIG. 7 is a plan view of the buffer film in FIG. 6, according to an exemplary embodiment.

FIG. 6 is a perspective view of a display device including a buffer film 304 according to the third exemplary embodiment, and FIG. 7 is a plan view of the buffer film 304 according to the third exemplary embodiment. The buffer film 304 may be coupled to the substrate 301 in a manner as illustrated in FIG. 1 with respect to the first exemplary embodiment.

Referring to FIG. 6, a light emitting element layer 302 and an encapsulation thin film layer 303 are formed on the substrate 301. The buffer film 304 and an optical film 305 may be sequentially deposited on the encapsulation thin film layer 303, like the structure of the first and second exemplary embodiments. As shown in FIG. 7, the buffer film 304 may be made of a shape including the edge portion having an opening O on the center portion. The edge portion may enclose, e.g., completely enclose, the opening O on the center portion. The upper surface and the lower surface of the buffer film 304 may be adhered to the edge portion of the optical film 305 and the edge portion of the encapsulation thin film layer 303, respectively.

For example, the upper surface and the lower surface of the buffer film 304 may be substantially the same, and only the edge portion of the buffer film 304 may correspond to the adhesion region A and the center portion, except for the edge portion, may correspond to the opening O. In this case, compared with the buffer films 104 and 204 according to the first and second exemplary embodiments, the buffer film material and the adhesion material may be saved. In this regard, only the lower surface of the buffer film 304 is adhered to the edge portion of the encapsulation thin film layer 303 corresponding to the non-active region of the light emitting element layer 302, and thereby, when detaching the optical film 305 under the rework process, the possibility of damage to the light emitting element layer 302 may be further reduced and/or prevented. Also, the buffer film 304 includes the opening O such that, e.g., the visibility of the display device may be improved.

In the third exemplary embodiment, the strength of adhesion between the buffer film 304 and the optical film 305 may be stronger or weaker than the strength of adhesion between the buffer film 304 and the encapsulation thin film layer 303. The effect thereto during the rework process is the same as the first and second exemplary embodiments.

In regard to each of the first to third exemplary embodiments, the optical films 105, 205, and 305 may be a polarizer or an ultraviolet (UV) preventing compensation film. The buffer films 104, 204, and 304 may be an optically clear adhesive or a functional film for reducing the possibility of and/or preventing water/moisture ($H_2O$) and oxygen ($O_2$) from penetrating into the encapsulation thin film layers 103, 203, and 303.

The buffer films 104, 204, and 304 may, e.g., protect the encapsulation thin film layers 103, 203, and 303 from the outside, compensate a crack of the surface of the encapsulation thin film layer 103, 203, and 303 or a crack of the surface of the optical film 105, 205, and 305, and function as a protecting film for reducing and/or preventing a push due to stress of the edge portion of the encapsulation thin film layers 103, 203, and 303 or the optical films 105, 205, and 305. The buffer films 104, 204, and 304 may have a function of, e.g., compensating a step as a set to be suitable for a standard and an object under assembly along with the set, and an assistance film assisting in aligning the deposited layers. The light emitting element layers 102, 202, and 302 may include the organic light emitting element. Also, the display device may be a flexible display device.

By way of summation and review, a display device may include a base substrate that has a light emitting element layer thereon and a glass encapsulation substrate covering the base substrate. The base substrate and the encapsulation substrate may be attached to each other by a sealant. An optical film such as a polarizing plate (polarizer) may be deposited on the encapsulation substrate. However, after the optical film is deposited, when a foreign particle or a scratch exists on the optical film or a foreign particle or a void exists on the encapsulation substrate, the optical film is detached and discarded, the encapsulation substrate surface is cleansed, and a new optical film is attached. Then, except for the discard cost of the optical film, the display device may be used such that the cost is reduced. Further, the sealant may be used for the encapsulation substrate and the base substrate so as to be adhered together at edges thereof. The adhesive strength of the sealant may be excellent such that the encapsulation substrate may be prevented from being lifted when detaching the optical film.

Alternatively, the base substrate of a display device, e.g., to obtain an optical characteristic such as outdoor visibility, may be encapsulated by a thin film instead of the encapsulation substrate. The thin film may be formed by applying a deposition material or a combination of a thin film glass and an organic material. In this case, the optical film may be adhered on the encapsulation thin film layer. However, when the foreign particle or the scratch exists on the optical film or the foreign particle or the void exists on the encapsulation thin film layer, if the optical film is detached for rework, the light emitting element layer on the substrate may also be detached along with the encapsulation thin film layer. If the light emitting element layer is detached, the light emitting features may not be properly performed or driving deterioration may be generated such that the display device may have to be discarded along with the optical film, and thereby a loss of time and cost is generated and the yield is deteriorated.

In contrast, embodiments relate to a display device and to a display device including a buffer film between an optical film and an encapsulation thin film layer. Accordingly, when detaching of optical film is sought for a reworking process, the possibility of lifting of a light emitting element layer occurring along with the encapsulation thin film layer may be reduced and/or prevented, thereby providing a display device that effectively improves a yield. Further, the display device including the buffer film so that the possibility of lifting of the light emitting element layer is reduced and/or prevented when removing the optical film, may improve work efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
 a substrate;
 a light emitting element layer that is on the substrate and that includes a light emitting element;
 an encapsulation thin film layer that is on the substrate and the light emitting element layer and that encapsulates the light emitting element layer;
 a buffer film on the encapsulation thin film layer and adhered to the encapsulation thin film layer; and
 an optical film on the buffer film and adhered to the buffer film, wherein:
 the buffer film includes an edge portion and an opening at a center portion, and
 an upper surface and a lower surface of the buffer film are adhered to an edge portion of the optical film and an edge portion of the encapsulation thin film layer, respectively.

2. The display device of claim 1, wherein the optical film is a polarizer.

3. The display device of claim 1, wherein the optical film is an ultraviolet preventing compensation film.

4. The display device of claim 1, wherein an adhesion between the buffer film and the optical film is weaker than an adhesion between the buffer film and the encapsulation thin film layer.

5. The display device of claim 1, wherein an adhesion between the buffer film and the optical film is stronger than an adhesion between the buffer film and the encapsulation thin film layer.

6. The display device of claim 1, wherein the buffer film is an optically clear adhesive or a functional film for preventing moisture and oxygen from penetrating into the encapsulation thin film layer.

7. The display device of claim 1, wherein the light emitting element is an organic light emitting element.

* * * * *